(12) United States Patent
Shiga et al.

(10) Patent No.: US 9,847,409 B2
(45) Date of Patent: Dec. 19, 2017

(54) SEMICONDUCTOR DEVICE AND MANUFACTURING METHOD FOR THE SAME

(71) Applicant: DENSO CORPORATION, Kariya, Aichi-pref. (JP)

(72) Inventors: Tomofusa Shiga, Nukata-gun (JP); Hiromitsu Tanabe, Chiryu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/798,712

(22) Filed: Jul. 14, 2015

(65) Prior Publication Data

US 2016/0020310 A1    Jan. 21, 2016

(30) Foreign Application Priority Data

Jul. 16, 2014    (JP) .................................. 2014-146275

(51) Int. Cl.
*H01L 29/739*    (2006.01)
*H01L 21/66*    (2006.01)
(Continued)

(52) U.S. Cl.
CPC .......... *H01L 29/7397* (2013.01); *H01L 22/14* (2013.01); *H01L 22/32* (2013.01); *H01L 23/4824* (2013.01); *H01L 23/49562* (2013.01); *H01L 24/48* (2013.01); *H01L 29/0696* (2013.01); *H01L 29/407* (2013.01); *H01L 29/4236* (2013.01); *H01L 29/4238* (2013.01);
(Continued)

(58) Field of Classification Search
CPC ........................ H01L 29/4236; H01L 29/7397
See application file for complete search history.

(56) References Cited

U.S. PATENT DOCUMENTS

| 4,814,283 A | 3/1989 | Temple et al. |
| 6,433,424 B1 * | 8/2002 | Sammon ....................... 257/735 |

(Continued)

FOREIGN PATENT DOCUMENTS

| JP | 2006-186154 A | 7/2006 |
| JP | 2007-266570 A | 10/2007 |

(Continued)

*Primary Examiner* — Bilkis Jahan
*Assistant Examiner* — Victor Barzykin
(74) *Attorney, Agent, or Firm* — Posz Law Group, PLC

(57) ABSTRACT

A semiconductor device provides an element arrangement region on a semiconductor substrate including: a first semiconductor region on the semiconductor substrate; a second semiconductor region on the first semiconductor region; multiple trench gates penetrating the first semiconductor region and reaching the second semiconductor region; a third semiconductor region contacting the trench gate; a fourth semiconductor region on a rear surface; a first electrode connected to the first and second semiconductor regions; and a second electrode connected to the fourth semiconductor region. Each trench gate includes a main trench gate for generating a channel and a dummy trench gate for improving a withstand voltage of a component. The device further includes: a dummy gate wiring for applying a predetermined voltage to the dummy trench gate; and a dummy pad connected to the dummy gate wiring. The dummy pad and the first electrode are connected by a conductive member.

5 Claims, 7 Drawing Sheets

(51) Int. Cl.
*H01L 23/495* (2006.01)
*H01L 23/00* (2006.01)
*H01L 29/06* (2006.01)
*H01L 29/423* (2006.01)
*H01L 29/66* (2006.01)
*H01L 23/482* (2006.01)
*H01L 29/40* (2006.01)

(52) U.S. Cl.
CPC .... *H01L 29/66348* (2013.01); *H01L 29/0619* (2013.01); *H01L 2224/4813* (2013.01); *H01L 2924/00014* (2013.01); *H01L 2924/13055* (2013.01); *H01L 2924/13091* (2013.01)

(56) References Cited

U.S. PATENT DOCUMENTS 6,809,348 B1  10/2004  Suzuki et al.
2002/0050633 A1*  5/2002  Matsumoto ............ H01L 23/64
                                        257/685
2006/0157779 A1*  7/2006  Kachi ............... H01L 29/66727
                                        257/330
2006/0261391 A1*  11/2006  Nakazawa .......... H01L 27/0255
                                        257/296
2009/0189181 A1*  7/2009  Koyama ............. H01L 29/0696
                                        257/139
2009/0189219 A1*  7/2009  Shinbori ............ H01L 29/407
                                        257/334
2011/0220962 A1  9/2011  Koyama et al.
2013/0037853 A1*  2/2013  Onozawa ........... H01L 29/0661
                                        257/139

FOREIGN PATENT DOCUMENTS

JP    2010-135677 A    6/2010
JP    2013-183143 A    9/2013
JP    2013-251466 A    12/2013

\* cited by examiner

SEMICONDUCTOR DEVICE AND MANUFACTURING METHOD FOR THE SAME

CROSS REFERENCE TO RELATED APPLICATIONS

This application is based on Japanese Patent Application No. 2014-146275 filed on Jul. 16, 2014, the disclosure of which is incorporated herein by reference.

TECHNICAL FIELD

The present disclosure relates to a semiconductor device including an insulated gate bipolar transistor having a dummy trench gate, and a manufacturing method for the semiconductor device.

BACKGROUND

It has been known that a trench gate is arranged for improving the withstand voltage of an insulated gate bipolar transistor (IGBT). The testing of withstand voltage of an insulated film or measurement of a margin at a dummy trench gate is performed by applying a predetermined potential between a gate electrode and an emitter electrode of the dummy trench gate as disclosed in Patent Document 1.

However, it is common that the gate electrode is connected to the emitter electrode during manufacturing an element and the dummy gate trench is fixed to have the same potential as the emitter potential of the IGBT. Accordingly, the testing of withstand voltage for the dummy trench gate cannot be operated after completing the formation of the upper layer (i.e., the outer portion of the surface of a semiconductor substrate) of the IGBT.

Since the distributions of electrical field in a variety of elements for constituting an IGBT are different in the process of forming the upper layer and the completion of forming the upper layer, it is possible that the withstand voltage cannot be accurately measured in a conventional method.

[Patent Document 1] Japanese Patent Application Publication No. 2013-251466

SUMMARY

It is an object of the present disclosure to provide a semiconductor device that conducts a withstand voltage testing for a dummy trench gate accurately. In addition, the present disclosure also provides a manufacturing method for the semiconductor device.

A first aspect of the present disclosure relates to a semiconductor device. The semiconductor device provides an element arrangement region arranged at a main surface side of the semiconductor substrate that includes: a first semiconductor region that is arranged in a surface portion of the semiconductor substrate at the main surface side; a second semiconductor region that contacts the first semiconductor region and is arranged at a position deeper than the first semiconductor region; a plurality of trench gates that penetrate the first semiconductor region and reach the second semiconductor region; a third semiconductor region that is arranged in the first semiconductor region to be in contact with each of the plurality of trench gates; a fourth semiconductor region that is arranged in a surface portion of the semiconductor substrate at a rear surface side opposite to the main surface side; a first electrode that is arranged on a main surface and electrically connected to the first semiconductor region and the second semiconductor region; and a second electrode that is arranged on a rear surface and electrically connected to the fourth semiconductor region. Each of the plurality of trench gates includes a main trench gate for generating a channel by voltage application and a dummy trench gate without contribution to generating a channel for improving a withstand voltage of the semiconductor device. The semiconductor device further includes: a dummy gate wiring that is arranged on the main surface of the semiconductor substrate for applying a predetermined voltage to the dummy trench gate; and a dummy pad that is connected electrically to the dummy gate wiring. The dummy pad and the first electrode are mutually connected electrically through a conductive member at the main surface side of the semiconductor substrate.

A second aspect of the present disclosure relates to a manufacturing method of a semiconductor device providing an element arrangement region at a main surface side of a semiconductor substrate including: a first semiconductor region that is arranged in a surface portion of the semiconductor substrate at the main surface side; a second semiconductor region that contacts the first semiconductor region and is arranged at a position deeper than the first semiconductor region; a plurality of trench gates that penetrate the first semiconductor region and reach the second semiconductor region; a third semiconductor region that is arranged in the first semiconductor region to be in contact with each of the plurality of trench gates; a fourth semiconductor region that is arranged in a surface portion of the semiconductor substrate at a rear surface side opposite to the main surface side; a first electrode that is arranged on a main surface and electrically connected to the first semiconductor region and the second semiconductor region; and a second electrode that is arranged on a rear surface and electrically connected to the fourth semiconductor region, in which each of the plurality of trench gates includes a main trench gate for generating a channel by voltage application and a dummy trench gate without contribution to generating a channel for improving a withstand voltage of a component. The method includes: forming the first semiconductor region, the second semiconductor region, the third semiconductor region and the fourth semiconductor region in the semiconductor substrate; forming the plurality of trench gates in the surface portion of the semiconductor substrate at the main surface side subsequent to the forming of the first semiconductor region, the second semiconductor region, the third semiconductor region and the fourth semiconductor region; forming a dummy gate wiring connected to the dummy trench gate as a part of each of the plurality of trench gates for applying a predetermined voltage to a gate electrode of the dummy trench gate subsequent to the forming of the plurality of trench gates; forming a dummy pad electrically connected to the dummy gate wiring to be in contact with a probe for a withstand voltage testing subsequent to the forming of the dummy gate wiring; forming the first electrode on the main surface of the semiconductor substrate subsequent to the forming of the dummy gate wiring; performing a withstand voltage testing by bringing the probe into contact with the dummy pad and the first electrode respectively subsequent to the forming the dummy pad and the first electrode; and electrically connecting the dummy pad and the first electrode mutually so as to have a same potential level subsequent to the performing of the withstand voltage testing.

According to the first and second aspects of the present disclosure, the dummy pad and the first electrode are mutually connected electrically by the conductive member at the main surface side of the semiconductor substrate. In other words, the dummy pad and the first electrode are arranged to be exposed at the upper layer above the main surface of the semiconductor substrate prior to the electrical connection. Accordingly, it is possible to apply a predetermined voltage between the dummy pad and the first electrode by bringing the probe into contact with the dummy pad and the first electrode from outside prior to making the electrical connection mutually. That is, it is possible to conduct a withstand voltage testing for the dummy trench gate when the upper layer is nearly finished. Therefore, it is possible to obtain the result of a withstand voltage testing accurately as compared to the conventional method.

BRIEF DESCRIPTION OF THE DRAWINGS

The above and other objects, features and advantages of the present disclosure will become more apparent from the following detailed description made with reference to the accompanying drawings. In the drawings:

FIG. 1 is a cross-sectional view taken along line I-I of FIG. 2;

FIG. 10 is also a diagram that shows a cross sectional view taken along line X-X of FIG. 11;

DETAILED DESCRIPTION

The following describes the embodiments of the present disclosure based on the drawings. It is noted that an x-direction, a y-direction perpendicular to the x-direction, and a z-direction linearly independent of the x-direction and the y-direction are defined in each diagram.

(First Embodiment)

The overall configuration of a semiconductor device according to the present embodiment is described with reference to FIG. 1 and FIG. 2.

The semiconductor device includes, for example, an insulated bipolar transistor (hereinafter referred to as IGBT). The semiconductor device mentioned below is a transistor having a trench-type gate in particular.

Figure 1:
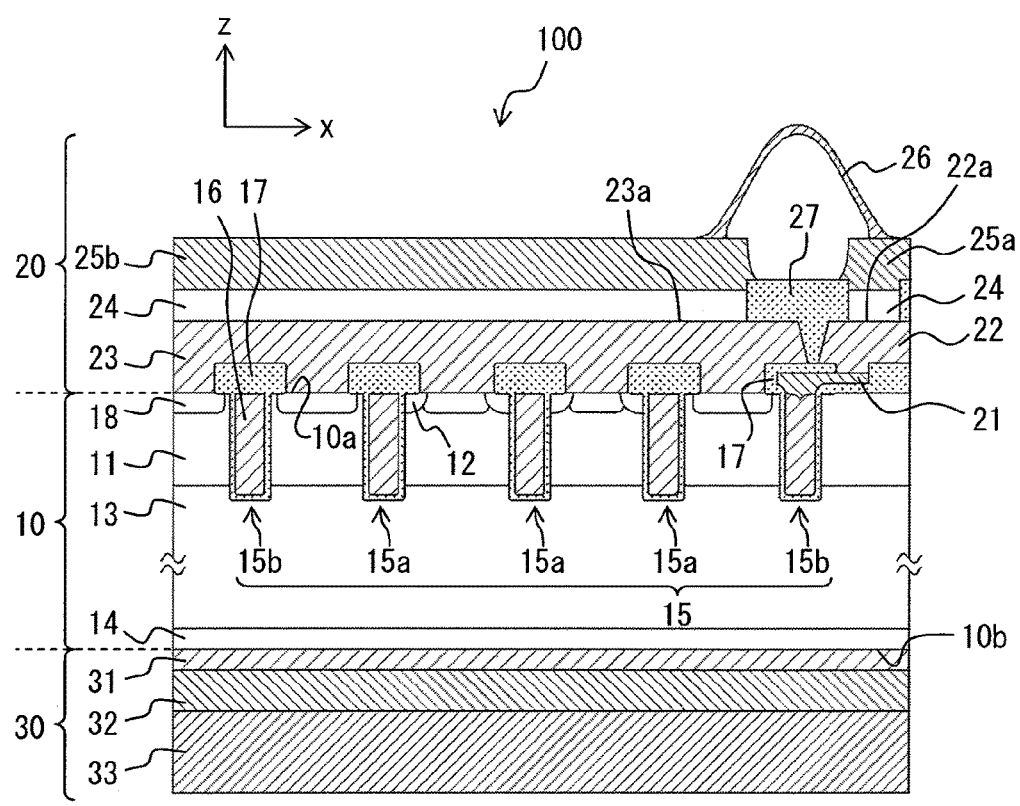
FIG. 1 is a diagram that shows the overview configuration of a semiconductor device according to a first embodiment.

As shown in FIG. 1, the semiconductor device 100 is configured by a semiconductor substrate 10, an upper layer 20 and a lower layer 30 of the semiconductor substrate 10. A base region 11 as a first semiconductor region, an emitter region 12 as a third semiconductor region, a drift region 13 as a second semiconductor region, and a collector region 14 as a fourth semiconductor region are formed on the semiconductor substrate 10. Moreover, a trench gate 15 is formed on the semiconductor substrate 10.

An upper layer 20 formed above a main surface 10a of the semiconductor substrate 10 includes a dummy gate wiring 21, a dummy pad 22, and an emitter electrode 23 as a first electrode. Moreover, a plating layer 24, a soldering layer 25, and a bonding wire 26 as a conductive member are formed in the present embodiment.

A lower layer 30 formed at the side of a rear surface 10b opposite to the main surface 10a includes a collector layer 31 as a second electrode, a soldering layer 32, and a collector-side lead frame 33 as a second lead frame.

The following describes each of the configuration elements in detail.

Initially, a variety of elements formed on the semiconductor substrate 10 are described. As shown in FIG. 1, the n-type drift region 13 is laminated on the surface of the p-type collector region 14 having a predetermined thickness in a z-direction (corresponding to a thickness direction). Then, the p-type base region 11 is laminated on the surface of the drift region 13. The surface of the base region 11 that is opposite to the drift region 13 is the main surface 10a of the semiconductor substrate 10. The trench gate 15 is formed so as to extend in the z-direction from the main surface 10a of the semiconductor substrate 10 and penetrate the base region 15 and lead to the drift region 13. The trench gate 15 includes a gate electrode 16 made of, for example, polysilicon inside, and an insulation film 17 for separating the gate electrode 16 and each of the semiconductor regions. The insulation film is, for example, an oxide film that projects toward the main surface 10a at the side of the upper layer 20.

A plurality of trench gates 15 are formed in the x-direction as shown in FIG. 1. The trench gate 15 includes: a main trench gate 15a that functions as a channel in the base region upon voltage application; and a dummy trench 15b that does not form a channel even if having voltage application. The n-type emitter region 12 is formed on a portion having a contact with the main trench 15a, which is the surface layer of the semiconductor substrate 10 at the side of the main surface 10a. In addition, a p-type base collector region 18 having concentration higher than the base region 11 is formed on the outermost surface layer of the base region 11.

Figure 2:
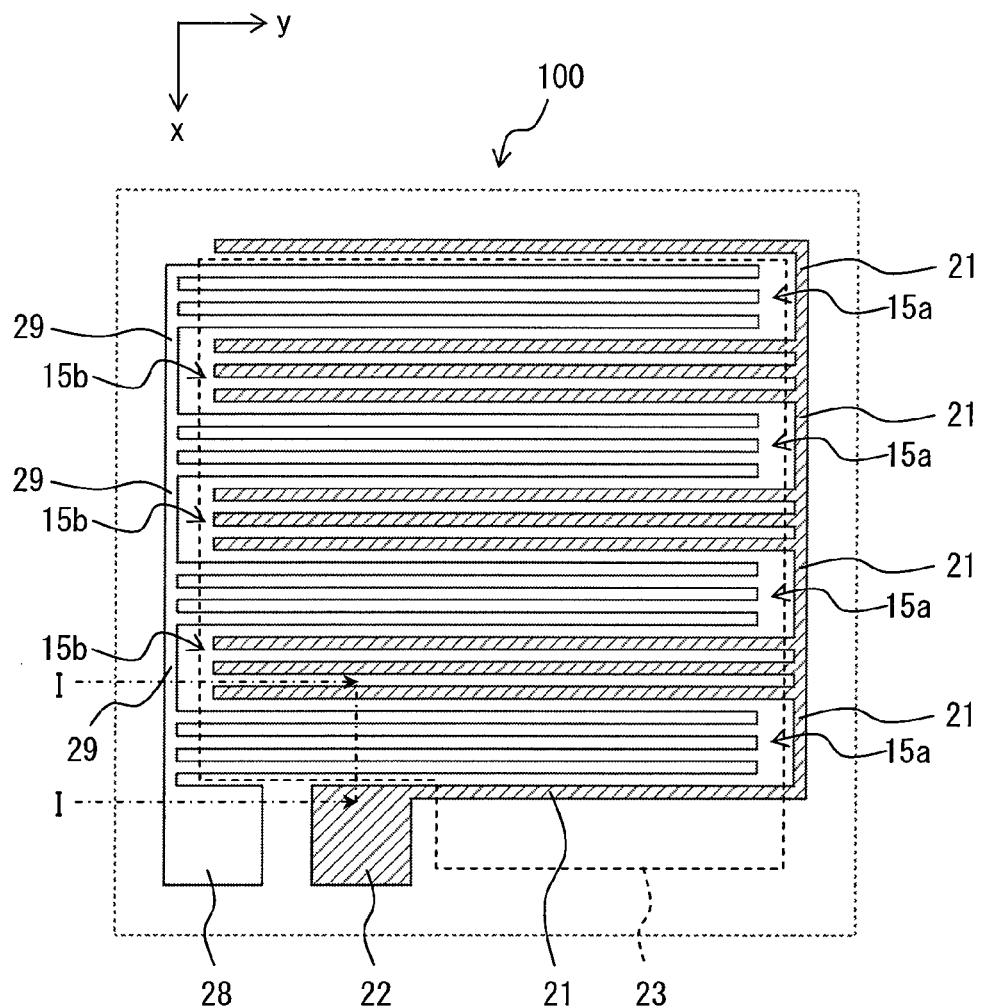
FIG. 2 is a diagram that shows a front view of the overview configuration of the semiconductor device, and it is noted that an emitter electrode is indicated by a broken line.

In addition, each of the trenches 15 is extended in a y-direction as shown in FIG. 2. It is noted that the present embodiment shows an example in which three main trenches 15a and three dummy trenches 15b are lined up alternatively so as to be in one group; however, it is not restricted to the above pattern. In addition, FIG. 2 is a frontal view; however, hatching is conducted on a portion relevant to the dummy trench 15b for simplicity.

Next, each of the elements formed on the upper layer 20 is described. As shown in FIG. 1, the dummy gate wiring 21 are formed so as to make an electrical contact with the gate electrode 16 of the dummy trench gate 15b. In FIG. 1, the dummy gate wiring 21 is illustrated only at the rightmost edge of the dummy trench gate 15b; however, each of the dummy trench gates 15b is interconnected by the dummy gate wiring 21 at the edge part in the y-direction as shown in FIG. 2. Then, the dummy pad 22 is formed by electrically connecting to the gate electrode 16 of the dummy trench gate 15b through the dummy gate wiring 21. Moreover, the emitter electrode 23 is formed as a laminated first electrode so as to making contact with the main surface 10a of the semiconductor substrate 10. The processes of forming the dummy pad 22 and the emitter electrode 23 according to the present embodiment are conducted simultaneously, and the heights in the z-direction are set to be the same. More specifically, the main surface 10a of the semiconductor substrate 10 is set to have the height that is identical to the heights of one surface 22a and one surface 23a respectively located at the opposite side. The dummy pad 22 and the emitter electrode 23 are spaced from each other by the insulation film 17 and the passivation film 27 in the x-direction.

On the other hand, the plating layer 24 in the z-direction is laminated on the dummy pad 22 and the emitter electrode 23, and the soldering layer 25 is further laminated on the plating layer 24. The soldering layer 25 is not formed on the passivation film 27. The soldering layer 25 includes: a soldering layer having a conductive state with the dummy pad 22; and a soldering layer 25b having a conductive state with the emitter electrode 23, and these layers are separated to each other. Then, in the present embodiment, the bonding wire 26 is linked between the soldering layer 25a and the soldering layer 25b, and the both layers are electrically connected to each other. As a result, the potential of the emitter electrode 23 and the potential of the gate electrode 16 of the dummy trench gate 15b are identical.

As shown in FIG. 2, the semiconductor device 100 includes a main gate pad 28 for applying a predetermined voltage to the main trench gate 15a, and the main trench pad 28 is connected to the gate electrode 16 of each of the main trench gates 15a through a main gate wiring 29. That is, at the time of driving the IGBT, a gate potential corresponding to an ON/OFF state of the IGBT is applied to the main gate pad 28 and a channel is formed in the base region near the trench gate 15a. However, the dummy trench gate 15b is at a potential level (typically at a GND level) identical to the potential of the emitter electrode 23.

The element formation region refers to a region inside the outer edge of the emitter electrode 23 as indicated by the broken line in FIG. 2. The dummy pad 22 according to the present embodiment is formed outside the element formation region when it is viewed from the semiconductor substrate 10 in the thickness direction, that is, the z-direction.

Next, the elements formed on the lower layer 30 are described. As shown in FIG. 1, a collector electrode 31 is formed to make a contact of the collector region 14 of the rear surface 10b opposite to the main surface 10a of the semiconductor substrate 10. In addition, the collector electrode 31 is electrically connected to the collector-side lead frame 33 through the soldering layer 32. The collector-side lead frame 33 is a part where a predetermined voltage is applied when driving the IGBT. That is, it is possible to provide a predetermined potential to the collector region 14 by placing the semiconductor substrate 10 on the collector-side lead frame 33 through the soldering layer 32.

Next, the manufacturing method for the semiconductor device 100 according to the present embodiment is described with reference to FIG. 1 and FIGS. 3 to 9.

Figure 3:
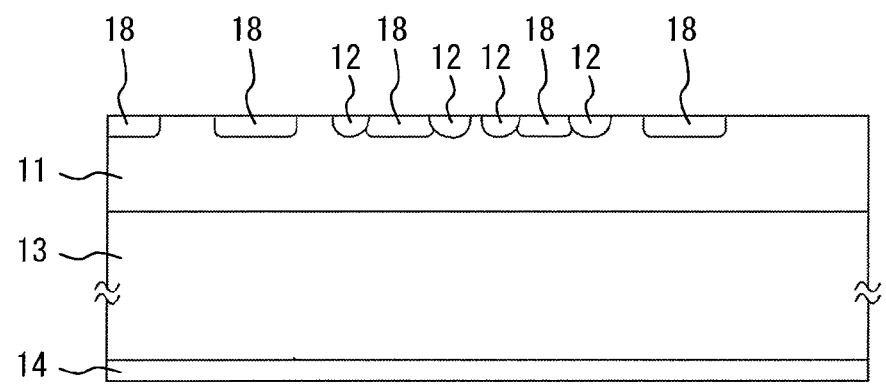
FIG. 3 is a diagram that shows a cross-sectional view of the formation of an element.

Initially, the element formation process is operated as shown in FIG. 3. The element formation process is a process for forming a part corresponding to the semiconductor substrate 10. In this process, ions as impurity are injected into a silicon wafer, and the base region 11, the emitter region 12, the drift region 13, the collector region 14 and the base-contact region 18 are formed through activation and diffusion through annealing. The emitter region 12 is formed at a location corresponding to the after-mentioned main trench gate 15a. Since this process complies with the well-known manufacturing method for an IGBT, the following does not describe the detailed description.

Figure 4:
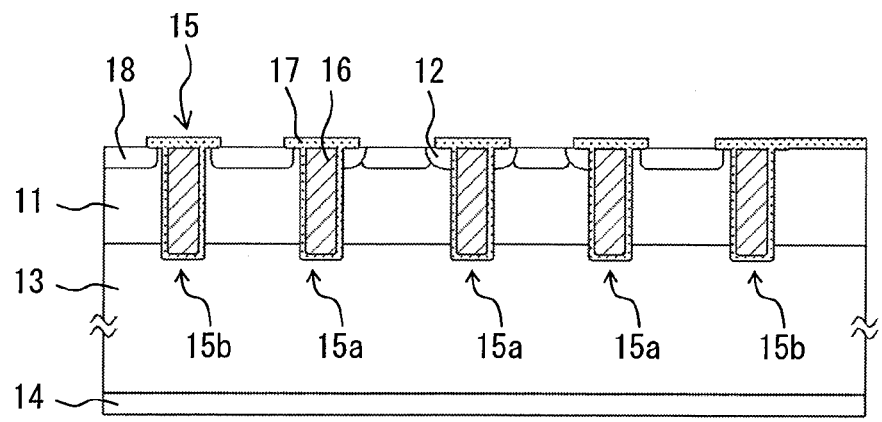
FIG. 4 is a diagram that shows a cross-sectional view of the formation of a trench gate.

Next, as shown in FIG. 4, the trench gate formation process is carried out for forming the trench gate 15. In this process, a trench is formed by dry etching, particularly plasma etching. Then, the insulation film 17 is covered by the trench inner wall through CVD. The insulation film 17 according to the present embodiment is a silicon oxide film. Moreover, the gate electrode 16 made of poly-silicon is buried into the trench. Then, the insulation film 17 is coated on the gate electrode 16 and the trench gate 15 is formed so that the emitter electrode 23, which is formed later, and the gate electrode 16 are not conductive to each other. The trench gate 15, with which the emitter region 12 has contact, corresponds to the main trench gate 15a, and the trench gate 15 excluding the main trench gate 15a corresponds to the dummy trench gate 15b.

Figure 5:
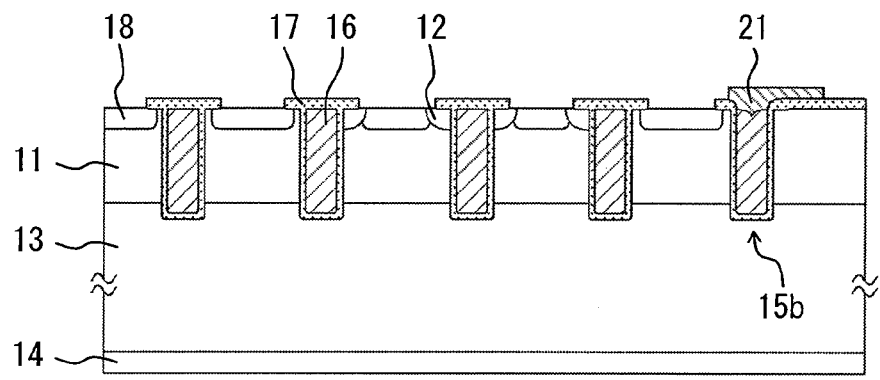
FIG. 5 is a diagram that shows a cross-sectional view of a dummy trench gate wiring formation process.

Next, as shown in FIG. 5, the dummy gate wiring formation process is carried out. This process forms the dummy gate wiring 21 for applying a predetermined potential to the gate electrode 16 of the dummy trench gate 15b. The dummy gate wiring 21 is, for example, an aluminum wiring. After the insulation film 17 for covering the gate electrode 16 is peeled off from the dummy trench gate 15b, aluminum is vaporized through CVD. The dummy gate wiring 21 is formed through the insulation film on the main surface 10a of the semiconductor substrate 10. As described above, the dummy trench gates 15b are interconnected to each other at the edge part in the y-direction as shown in FIG. 2.

Figure 6:
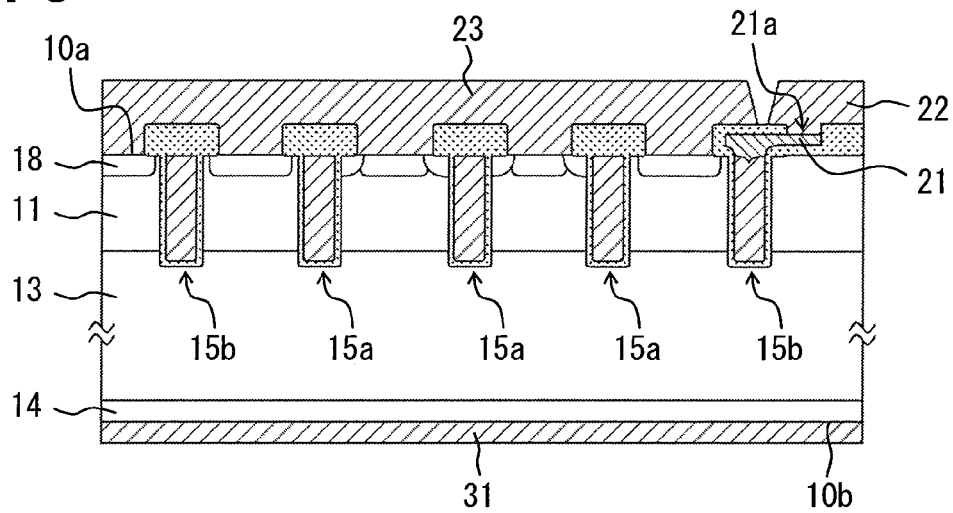
FIG. 6 is a diagram that shows a cross-sectional view of a dummy pad formation process and a first electrode formation process.

Next, as shown in FIG. 6, the dummy pad formation process and the first electrode formation process are carried out. It is noted that the first electrode formation process according to the present embodiment is the emitter electrode formation process. In addition, the dummy pad formation process and the first electrode formation process can be carried out simultaneously. Firstly, the insulation film is coated on the dummy gate wiring 21, and the insulation of the emitter electrode 23 formed in the present process can be ensured. At this time, the entire dummy gate wiring 21 is not covered, and a contact hole 21a where one portion of the dummy gate wiring 21 is exposed is formed. Then, aluminum is vaporized by CVD and then the dummy pad 22 and the emitter electrode 23 are formed. The emitter electrode 23 is formed to make a contact with the main surface 10a of the semiconductor substrate 10. In addition, the dummy pad 22 is formed to be insulated from the emitter electrode 23 and to be electrically connected to the dummy gate wiring 21 passing through the contact hole 21a. It is noted that FIG. 6 also illustrates the collector electrode formation process for forming the collector electrode 31 on the rear surface 10b of the semiconductor substrate 10.

Figure 7:
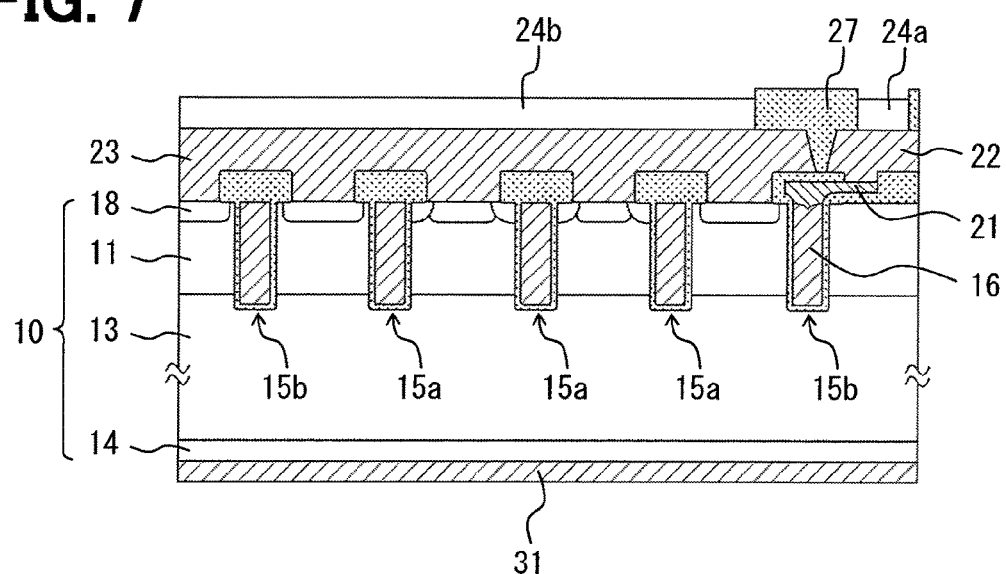
FIG. 7 is a diagram that shows a process of forming a plating layer and passivation film.

Next, as shown in FIG. 7, the process in which plating is provided on the surface of the dummy pad 22 and the emitter electrode 23 is carried out. Initially, the passivation film 27 is formed so as to separate the dummy pad 22 and the emitter electrode 23. The passivation film 27 is provided to electrically separate the dummy pad 22 and the emitter electrode 23, and covers a portion of the surfaces of the dummy pad 22 and the emitter electrode 23. Then, electroless plating is performed on the portion where the dummy pad 22 and the emitter electrode 23 is not covered by the passivation film 27 and then the plating layer 24 is formed. It is noted that the reference numeral of the plating layer 24 formed on the dummy pad 22 is designated as 24a, and the reference numeral of the plating layer 24 formed on the emitter electrode 23 is designated as 24b.

The formation is complete for the region of the semiconductor substrate 10 in each process up to the present process. The structure does not change in the later processes. It is noted that the gate electrode 16 of the main trench gate 15a and the gate electrode 16 of the dummy trench gate 15b are insulated.

Figure 8:
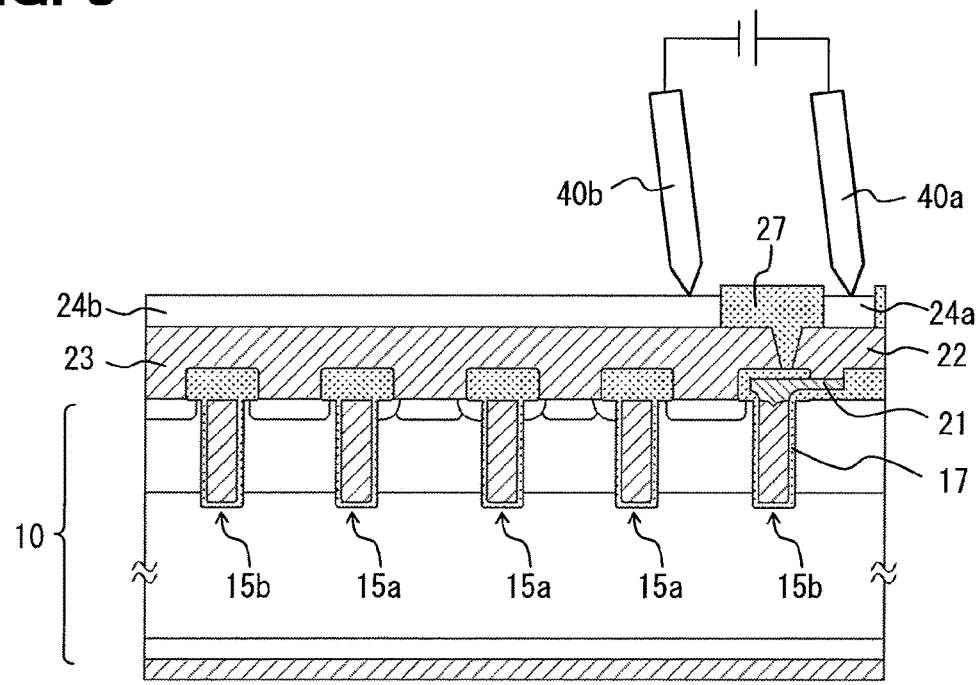
FIG. 8 is a diagram that shows a withstand voltage testing process.

Next, as shown in FIG. 8, the withstand voltage testing process is carried out. The withstand voltage testing process is a process that examines the withstand voltage of the insulation film 17 of the dummy trench gate 15b. A separate testing probe 40 for testing a withstand voltage comes into contact with the plating layer 24a and the plating layer 24b respectively. Then, a potential difference required for testing is generated between the testing probe 40a coming into contact with the plating layer 24a and the testing probe 40b coming into contact with the plating layer 24b. The generation pattern for a potential difference is arbitrary depending on the type of testing such as applying a potential to a pulse shape or applying a potential for a predetermined time. Since the insulation is tested between the dummy pad 22 and the emitter electrode 23, the tester for examining insulation can also be used.

Figure 9:
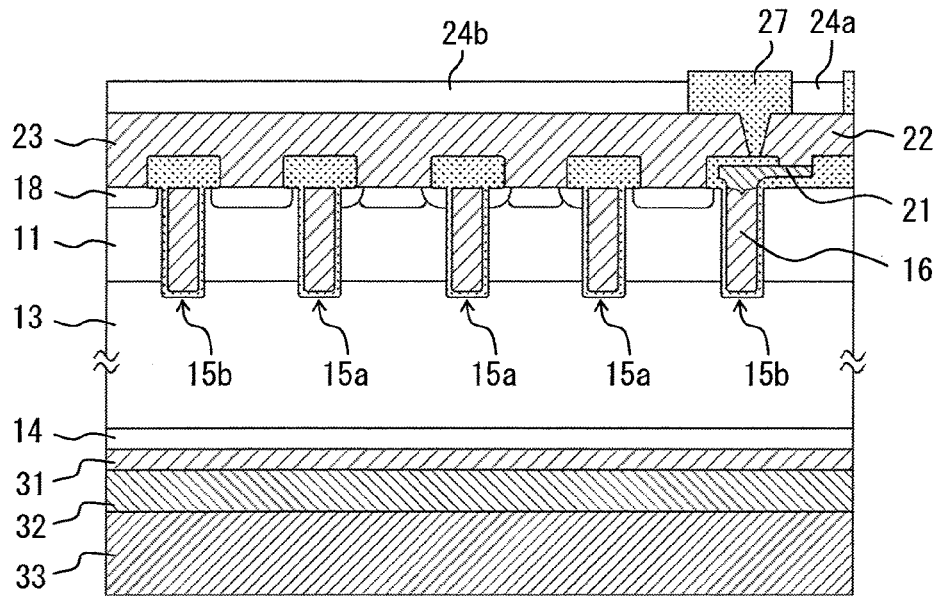
FIG. 9 is a diagram that shows a cross-sectional view of forming a lower layer.

Next, as shown in FIG. 9, the collector-side lead frame 33 and the collector electrode 31 are electrically connected through the soldering layer 32 so that the collector 31 and the collector-side lead frame 33 is in opposite.

Finally, an electrical connection process is carried out. The electrical connection process according to the present embodiment is a bonding process that makes the dummy pad 22 and the emitter electrode 23 electrically connected through the bonding wire 26 at the same potential level. In this process, the soldering layers 25a, 25b are respectively formed on the parts corresponding to the plating layers 24a, 24b. Then, the soldering layer 25a and the soldering layer 25b are connected by the bonding wire 26 and both of the soldering layers 25a, 25b are electrically connected. Thus, the semiconductor device 100 illustrated in FIG. 1 is formed.

Next, the functional effect of the semiconductor device 100 according to the present embodiment is described.

With regard to the semiconductor device 100, the formation of the regions of the semiconductor substrate 10 is complete in all processes prior to the withstand voltage testing process, and the structure does not change in the processes subsequent to the withstand voltage testing process. The gate electrode 16 of the main trench gate 15a and the gate electrode 16 of the dummy trench gate 15b are electrically insulated prior to the withstand voltage testing process. The dummy pad 22 and the emitter electrode 23 are formed to be exposed to the side of the upper layer 20 relative to the main surface 10a of the semiconductor substrate 10 in the early stage of the electrical connection process as the process in which both of the dummy pad 22 and the emitter electrode 23 are connected electrically. Alternatively, the plating layer 24 electrically connected to the dummy pad 22 and the emitter electrode 23 is formed to be exposed to the upper layer 20 relative to the main surface 10a of the semiconductor substrate 10 in the early stage where an electrical connection is mutually made. Accordingly, prior to make an electrical connection mutually, a predetermined potential can be applied to the dummy pad 22 and the emitter electrode 23 by applying the testing probe 40 to the dummy pad 22 and the emitter electrode 23. In other words, the withstand voltage testing for the insulation film 17 on the dummy trench gate 15b can be carried out when the semiconductor substrate 10 and the upper layer 20 are nearly finished. Therefore, the result of testing withstand voltage can be more accurately measured.

(Second Embodiment)

Figure 10:
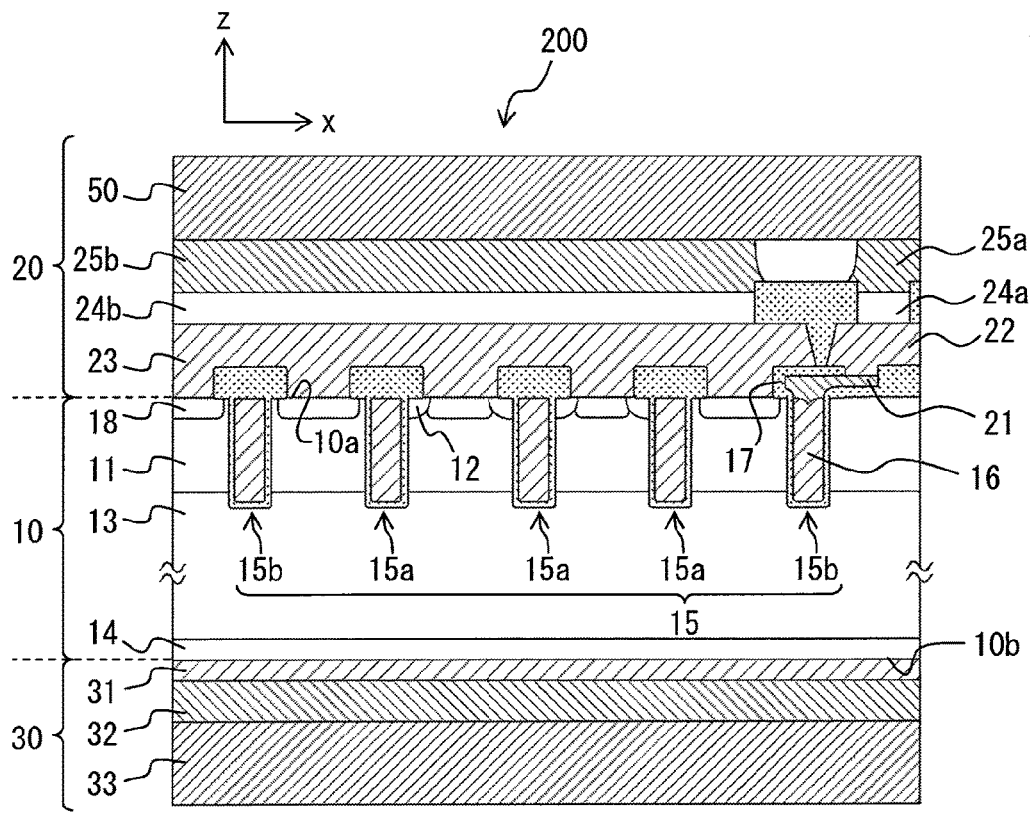
FIG. 10 is a diagram that shows the overview configuration of a semiconductor device according to a second embodiment.

The first embodiment describes an example in which the dummy pad 22 and the emitter electrode 23 (i.e., first electrode) are electrically connected through the bonding wire 26 as a conductive member. However, the present embodiment describes that the dummy pad 22 and the emitter electrode 23 are connected by an emitter-side lead frame 50 as a first lead frame as shown in FIG. 10.

A semiconductor device 200 according to the present embodiment includes, for example, the emitter-side lead frame 50 made of copper in replacement of the bonding wire 26 in the semiconductor device 100 according to the first embodiment.

Figure 11:
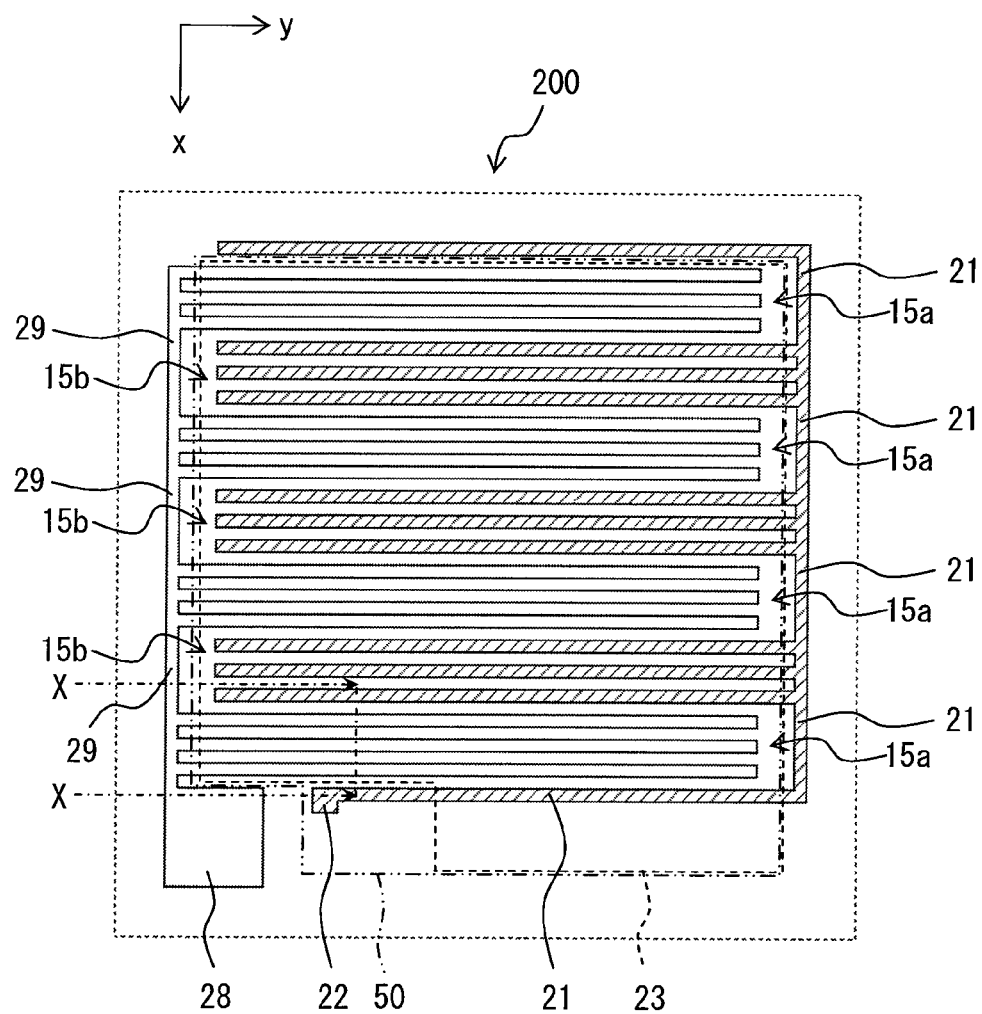
FIG. 11 is a diagram that shows a front view of the overall configuration of the semiconductor device, and it is noted that an emitter electrode and a lead frame at the side of the emitter are indicated by a broken line and a two-dot chain line respectively.

The emitter-side lead frame 50 is connected to the emitter electrode 23 through the soldering layer 25b and the plating layer 24b. As shown in FIG. 10 and FIG. 11, the emitter-side lead frame 50 is formed to overlap the emitter electrode 23 when it is viewed from the semiconductor substrate 10 in a thickness direction (i.e., z-direction). In addition, the emitter-side lead frame 50 overlaps the dummy pad 22 when it is viewed from the z-direction, and the emitter-side lead frame 50 and the dummy pad 22 are arranged to face each other. Then, the soldering layer 25a and the plating layer 24 are formed in this opposing space, and the emitter-side lead frame 50 and the dummy pad 22 are electrically connected to each other through the soldering layer 25a and the plating layer 24.

Since the present embodiment does not use the bonding wire 26 to make an electrical connection with the dummy pad 22 and the emitter electrode 23, the dummy pad 22 is formed to be smaller than the one in the first embodiment.

The following does not describe the configuration elements excluding the emitter-side lead frame 50 that are similar to the one in the first embodiment.

The manufacturing method for the semiconductor device 200 according to the present embodiment excluding an electrical connection process is similar to the first embodiment. On the other hand, the electrical connection process according to the present embodiment is a first lead frame formation process that electrically connects the dummy pad 22 and the emitter electrode 23 through the emitter-side lead frame 50 so as to make the dummy pad 22 and the emitter electrode 23 at the same potential level. In this process, the soldering layers 25a and 25b are initially formed on the parts corresponding to the plating layers 24a and 24b. Then, the emitter-side lead frame 50 is fixed so as to be placed on the upper surfaces of the soldering layers 25a, 25b. The emitter-side lead frame 50 is configured to come into contact with the soldering layer 25b corresponding to the emitter electrode 23 and come into contact with the soldering layer 25a corresponding to the dummy pad 22 at the same time. Therefore, the semiconductor device 100 illustrated in FIG. 1 is formed.

The functional effect of the semiconductor device 200 according to the present embodiment is described below.

For example, the dummy pad 22 described in the first embodiment has to keep a size that is suitable to wire bonding. It is required to make the size larger (i.e., 300 μm to 500 μm) than in a case where the probe for testing withstand voltage is used. As it is not required to use the bonding wire 26 for connection in this embodiment, the size of the dummy pad 22 along an xy-plane can be made smaller in comparison with the configuration having the bonding wire 26. That is, the layout area of the semiconductor device 200 can be limited.

With regard to the configuration which needs the bonding wire 26 such as the first embodiment, since the bonding wire 26, which is not needed when not testing the withstand voltage of the trench gate, is required for making a connection for the gate electrode and the emitter electrode, the total number of the bonding wire 26 increases and leads to an increase in cost. However, the present embodiment can use the emitter-side lead frame 50 for fixing the emitter electrode 23 at a predetermined potential level, and the emitter-side lead frame 50 can also be used for making an electrical connection between the emitter electrode 23 and the dummy pad 22. Therefore, the cost in manufacturing the semiconductor device 200 can be limited.

Moreover, with regard to the present embodiment, while making an electrical connection between the emitter electrode 23 and the dummy pad 22, as the emitter-side lead frame 50 moves parallel in a z-direction and comes into contact with the soldering layer 25, it is possible to make the emitter electrode 23 and the dummy pad 22 to be at the same potential level. In other words, the emitter electrode 23 and the dummy pad 22 can be configured at the same potential level by the so-called self-alignment without the need of controlling the bonding position of the bonding wire 26 correctly.

(Modification)

In the above first embodiment, since the bonding wire 26 must be used for making connection in the electrical connection process, the dummy pad 22 is arranged in the region inside of the outer edge of the emitter electrode 23 as indicated by the broken line in FIG. 2, that is, the outer side of the element formation region.

However, in a case where an electrical connection is made between the emitter electrode 23 and the dummy pad 22 with the emitter-side lead frame 50 as described in the second embodiment, the dummy pad 22 can be formed inside of the element formation region. The dummy pad 22 is electrically connected to the dummy gate wiring 21, and may be arranged to make overlapping of the emitter-side lead frame 50 and the dummy pad 22 when it is viewed from the z-direction.

Figure 12:
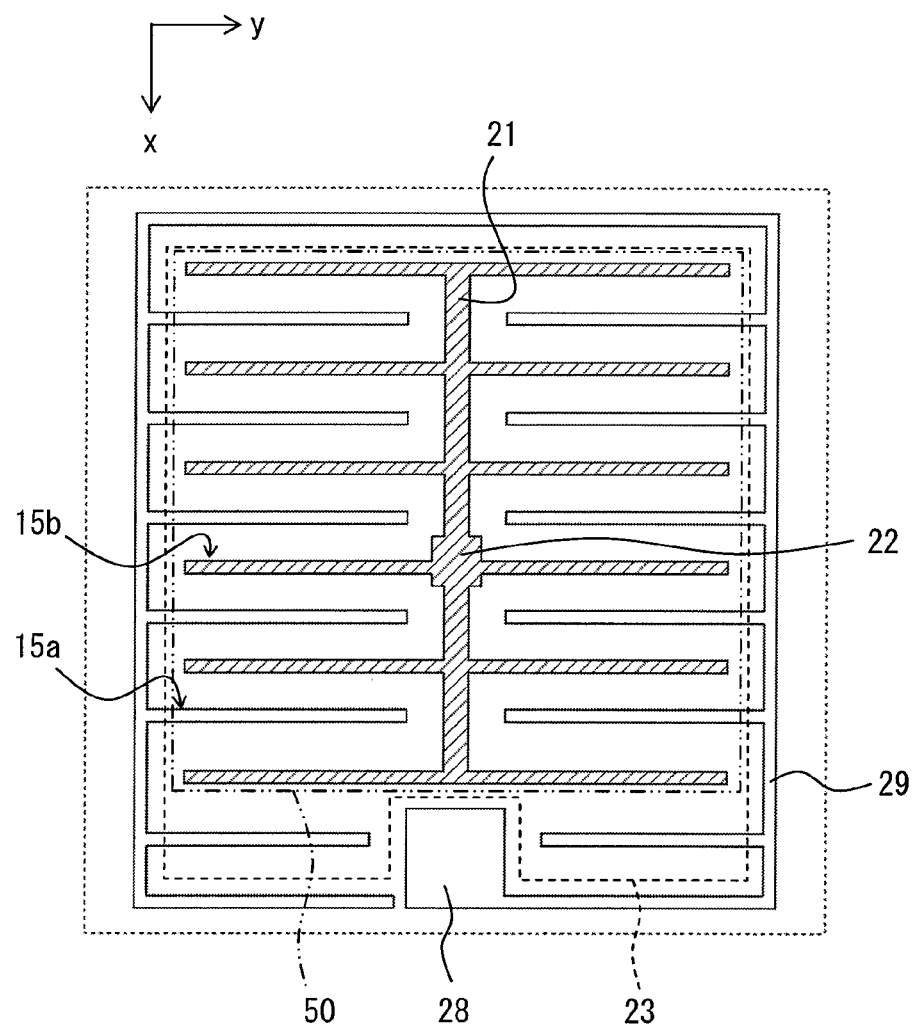
FIG. 12 is a diagram that shows a front view of the overall configuration of a semiconductor device according to a modification example, and it is noted that an emitter electrode and a lead frame at the side of the emitter are indicated by a broken line and a two-dot chain line respectively.

The dummy pad 22 according to the present modification example is formed inside of the outer edge (i.e., the element formation region) of the emitter electrode 23 indicated by the broken line as illustrated in FIG. 12. The dummy gate wiring 21 is formed to extend near the center of the element formation region in the x-direction, and the dummy trench gate 15b extends to the y-direction from the dummy gate wiring 21. The main trench gate 15a is formed to extend in the y-direction in the region between the adjacent dummy trench gates 15b in the x-direction.

As described in the present modification example, the area along the xy-plane of the IGBT can be used as the element formation region at the portion excluding the main gate pad 28 by arranging the dummy pad 22 inside the element formation region.

(Other Embodiment)

The preferred embodiments of the present enclosure are described above; however, the present disclosure is not restricted to the above embodiments. Various modifications and alternations of the present disclosure may be made by those skilled in the art without departing from the scope and spirit of the present disclosure.

The above-mentioned embodiments and the modification example illustrate that the withstand voltage testing process is carried out after the formation of the plating layer 24. However, the testing may be carried out by bringing the testing probe 40 into contact with the plating layer 24 when the dummy pad 22 and the emitter electrode 23 are in an exposed state.

The above embodiments and modification examples illustrate that the dummy pad 22 and the emitter electrode 23 are formed to have the identical height in the z-direction; however, it is not restricted to this situation. In fact, it can be ensured that the testing probe 40 comes into contact with the dummy pad 22 and the emitter electrode 23 by setting both to have the identical height in the z-direction.

The modification example illustrates the position of the dummy pad 22 is set near the center of the element formation region. However, the formation position of the dummy pad 22 is arbitrary if the dummy pad 22 is electrically connected to the dummy gate wiring 21, and the emitter-side lead frame 50 and the dummy pad 22 are formed to be overlapped when it is viewed from the z-direction.

The above embodiments and the modification example illustrate one example of the configuration material for each element; however, various modifications can be properly made. For example, the dummy pad wiring 21 is illustrated as an aluminum wiring. However, tungsten may also be used.

In addition, the above embodiments illustrate an example of a conductivity type in each semiconductor region. However, interchanging of an n-conductivity type and a p-conductivity type may be applicable.

The above embodiments and the modification example illustrate an IGBT as an example. However, a MOSFET having the trench gate 15 may be applicable.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claim is:

1. A semiconductor device, comprising:
an element arrangement region on a main surface side of
   a semiconductor substrate, the element arrangement
   region including:
   a first semiconductor region that is arranged in a
      surface portion of the semiconductor substrate at the
      main surface side;
   a second semiconductor region that contacts the first
      semiconductor region and is arranged at a position
      deeper than the first semiconductor region;
   a plurality of main trench gates that respectively penetrate the first semiconductor region and reach the
      second semiconductor region, and that respectively
      generate a channel by voltage application;
   a plurality of dummy trench gates that respectively
      penetrate the first semiconductor region and reach the second semiconductor region, and respectively improve a withstand voltage of the semiconductor device without generating a channel;

a third semiconductor region that is arranged in the first semiconductor region to be in contact with each of the plurality of main trench gates;

a fourth semiconductor region that is arranged in a surface portion of the semiconductor substrate at a rear surface side opposite to the main surface side;

a first electrode that is arranged on the main surface of the semiconductor substrate and is electrically connected to the first semiconductor region and the second semiconductor region; and a second electrode that is arranged on a rear surface of the semiconductor substrate and is electrically connected to the fourth semiconductor region, the semiconductor device further comprising:

a dummy gate wiring that is arranged on the main surface of the semiconductor substrate for applying a predetermined voltage to each of the plurality of dummy trench gates;

a dummy pad that is connected electrically to the dummy gate wiring; and a main gate pad that is connected to each of the plurality of main trench gates, wherein the dummy pad and the first electrode are mutually connected electrically through a conductive member at the main surface side of the semiconductor substrate, wherein the dummy pad and the main gate pad are arranged separately, and wherein the dummy gate wiring is electrically isolated from the first electrode.

2. The semiconductor device according to claim 1, wherein the dummy pad and the first electrode are mutually connected electrically by a bonding wire.

3. The semiconductor device according to claim 1, further comprising:

a first lead frame that is arranged to overlap the dummy pad and the first electrode when it is viewed in a plan view from a thickness direction of the semiconductor substrate, wherein the dummy pad and the first electrode are mutually connected electrically by the first lead frame.

4. The semiconductor device according to claim 1, wherein the dummy pad is arranged to have a height identical to a height of the first electrode in the thickness direction of the semiconductor substrate.

5. The semiconductor device according to claim 1, wherein the dummy pad is arranged in the element arrangement region when it is viewed in a plan view from the thickness direction of the semiconductor substrate.

* * * * *